(12) United States Patent
Peng

(10) Patent No.: US 12,144,262 B2
(45) Date of Patent: Nov. 12, 2024

(54) STRUCTURE FOR PACKAGING A CRYSTAL OSCILLATOR

(71) Applicant: TXC CORPORATION, Taipei (TW)

(72) Inventor: Tzu-Hsiu Peng, Ping Cheng (TW)

(73) Assignee: TXC Corporation, Taipei (TW)

( * ) Notice: Subject to any disclaimer, the term of this patent is extended or adjusted under 35 U.S.C. 154(b) by 766 days.

(21) Appl. No.: 17/374,158

(22) Filed: Jul. 13, 2021

(65) Prior Publication Data
US 2022/0320416 A1 Oct. 6, 2022

(30) Foreign Application Priority Data
Mar. 30, 2021 (TW) .................................. 110111482

(51) Int. Cl.
*H10N 30/88* (2023.01)
*H03B 5/32* (2006.01)
*H10N 30/87* (2023.01)

(52) U.S. Cl.
CPC ............... *H10N 30/88* (2023.02); *H03B 5/32* (2013.01); *H10N 30/87* (2023.02)

(58) Field of Classification Search
CPC .......... H03H 9/10; H03H 9/1014; H03H 9/19; H03H 9/1021; H03H 9/0509; H03H 9/02157; H03B 5/32; H10N 30/87; H10N 30/88
See application file for complete search history.

(56) References Cited

U.S. PATENT DOCUMENTS

| 10,600,953 B2* | 3/2020 | Kojo | H01L 23/04 |
| 2012/0068578 A1* | 3/2012 | Takahashi | H03H 3/02 |
| | | | 310/344 |
| 2012/0133447 A1* | 5/2012 | Mizusawa | H03H 9/0595 |
| | | | 331/68 |
| 2012/0248938 A1* | 10/2012 | Kawanishi | H03H 9/0595 |
| | | | 310/370 |

(Continued)

FOREIGN PATENT DOCUMENTS

| CN | 1905364 A | 1/2007 |
| JP | 2017011552 A | 1/2017 |

(Continued)

OTHER PUBLICATIONS

Japanese Office Action mailed to Corresponding Patent Application No. 2021-128409 on Jul. 3, 2023.

(Continued)

*Primary Examiner* — J. San Martin
(74) *Attorney, Agent, or Firm* — Rosenberg, Klein & Lee

(57) ABSTRACT

A structure for packaging a crystal oscillator includes a package base, at least one glue, a resonant crystal blank, and a top cover. The top of the package base has a recess. The glue is formed in the recess. The resonant crystal blank has at least one opening, at least one border area, at least one connection area, and a resonant area. The opening is arranged between the border area and the resonant area. The border area is connected to the resonant area through the connection area. The border area is formed in the recess through the glue. The top cover is formed on the top of the package base. The top cover closes the recess, the at least one glue, and the resonant crystal blank.

9 Claims, 7 Drawing Sheets

(56) References Cited

U.S. PATENT DOCUMENTS

| | | | | |
|---|---|---|---|---|
| 2012/0313488 A1* | 12/2012 | Harada | ................ | H03H 9/105 |
| | | | | 310/346 |
| 2015/0015118 A1 | 1/2015 | Kamijo | | |
| 2016/0149555 A1* | 5/2016 | Sarata | .................... | H10N 30/88 |
| | | | | 310/348 |
| 2016/0226466 A1* | 8/2016 | Tsuda | ...................... | C22C 30/04 |
| 2016/0329484 A1* | 11/2016 | Iizuka | ...................... | H03H 9/10 |
| 2024/0162879 A1* | 5/2024 | Matsukawa | .............. | H03H 9/19 |

FOREIGN PATENT DOCUMENTS

| | | | |
|---|---|---|---|
| TW | 200721671 | A | 6/2007 |
| TW | 201526541 | A | 7/2015 |
| TW | 201724587 | A | 7/2017 |
| TW | 201832467 | A | 9/2018 |
| TW | 202023058 | A | 6/2020 |
| WO | 2016136283 | A1 | 9/2016 |

OTHER PUBLICATIONS

Official Action for Foreign Corresponding Patent Application No. 110111482/11120171350.

International Patent Office Official Action issued by a Foreign Patent Office for corresponding Application No. 2021-128409.

\* cited by examiner

STRUCTURE FOR PACKAGING A CRYSTAL OSCILLATOR

This application claims priority of Application No. 110111482 filed in Taiwan on 30 Mar. 2021 under 35 U.S.C. § 119; the entire contents of all of which are hereby incorporated by reference.

BACKGROUND OF THE INVENTION

Field of the Invention

The present invention relates to a package structure, particularly to a structure for packaging a crystal oscillator.

Description of the Related Art

Quartz elements have stable piezoelectric characteristics, which can provide accurate and wide reference frequency, clock control, timing functions, and noise filtering functions. In addition, quartz elements can also be used as sensors for vibration and pressure and important optical components. As a result, the quartz components play an important role in electronic products.

FIG. 1(a) is a cross-sectional view of a quartz resonator in the conventional technology. FIG. 1(b) is an exploded view of a quartz resonator in the conventional technology. Referring to FIG. 1(a) and FIG. 1(b), a quartz resonator 1 includes a ceramic base 10, a quartz crystal blank 11, a top cover 12, a glue 13, first conductive pads 14, second conductive pads 15, a first electrode layer 16, and a second electrode layer 17. The quartz crystal blank 11 formed in the recess of the ceramic base 10 through the glue 13 and the first conductive pads 14. The first electrode layer 16 and the second electrode layer 17 are respectively formed on the top surface and the bottom surface of the quartz crystal blank 11. The ceramic base 10 has conductive vias 100. The first conductive pads 14 are electrically connected to the second conductive pads 15 through the conductive vias 100. The top cover 12 shields the quartz crystal blank 11, the glue 13, the first conductive pads 14, the first electrode layer 16, and the second electrode layer 17. Since the quartz crystal blank 11 is a complete crystal blank, the vibration caused by the main vibrating portion is easily transmitted to outside, such that the resonant frequency of the quartz resonator 1 is unstable.

To overcome the abovementioned problems, the present invention provides a structure for packaging a crystal oscillator, so as to solve the afore-mentioned problems of the prior art.

SUMMARY OF THE INVENTION

The present invention provides a structure for packaging a crystal oscillator, which avoids transmitting the vibration caused by a fact that a crystal blank resonates to outside, thereby stabilizing the resonant frequency.

In an embodiment of the present invention, a structure for packaging a crystal oscillator includes a package base, at least one glue, a resonant crystal blank, and a top cover. The top of the package base has a recess. The glue is formed in the recess. The resonant crystal blank has at least one opening, at least one border area, at least one connection area, and a resonant area. The opening is arranged between the border area and the resonant area. The border area is connected to the resonant area through the connection area. The border area is formed in the recess through the glue. The top cover is formed on the top of the package base. The top cover closes the recess, the glue, and the resonant crystal blank.

In an embodiment of the present invention, the glue is a conductive glue.

In an embodiment of the present invention, the structure for packaging a crystal oscillator further includes an electrode layer, at least one first conductive pad, and a plurality of second conductive pads. The electrode layer is formed on the border area, the connection area, and the resonant area and electrically connected to the resonant area and the glue. The first conductive pad is formed in the recess and formed between the glue and the package base. The bottom of the package base is penetrated with conductive vias. The conductive vias are electrically connected to the first conductive pad. The plurality of second conductive pads are formed on the bottom surface of the package base and respectively electrically connected to the conductive vias.

In an embodiment of the present invention, the ratio of the area of the opening to the total area of the opening, the border area, the connection area, and the resonant area is larger than 0. The ratio is less than or equal to 0.35.

In an embodiment of the present invention, the at least one opening includes a closed-type opening and an opened-type opening.

In an embodiment of the present invention, the closed-type opening or the opened-type opening has a shape of U.

In an embodiment of the present invention, the at least one opening comprises two opened-type openings.

In an embodiment of the present invention, the at least one opening includes a first sub-opening and a second sub-opening. The first sub-opening is arranged between the head end and the tail end of the border area. The second sub-opening is surrounded by the first sub-opening, the border area, the connection area, and the resonant area.

In an embodiment of the present invention, the resonant crystal blank is an AT-cut resonant crystal blank or a SC-cut resonant crystal blank.

In an embodiment of the present invention, the number of the glue is even and the glue is uniformly formed in the recess.

In an embodiment of the present invention, the resonant area has a shape of rectangular, and an included angle between the at least one connection area and a long edge of the rectangular is larger than 120 degrees and less than 180 degrees.

To sum up, the structure for packaging a crystal oscillator forms the opening between the border area and the resonant area to avoid transmitting the vibration caused by a fact that the crystal blank resonates to outside, thereby stabilizing the resonant frequency.

Below, the embodiments are described in detail in cooperation with the drawings to make easily understood the technical contents, characteristics and accomplishments of the present invention.

DETAILED DESCRIPTION OF THE INVENTION

Figure 1A:
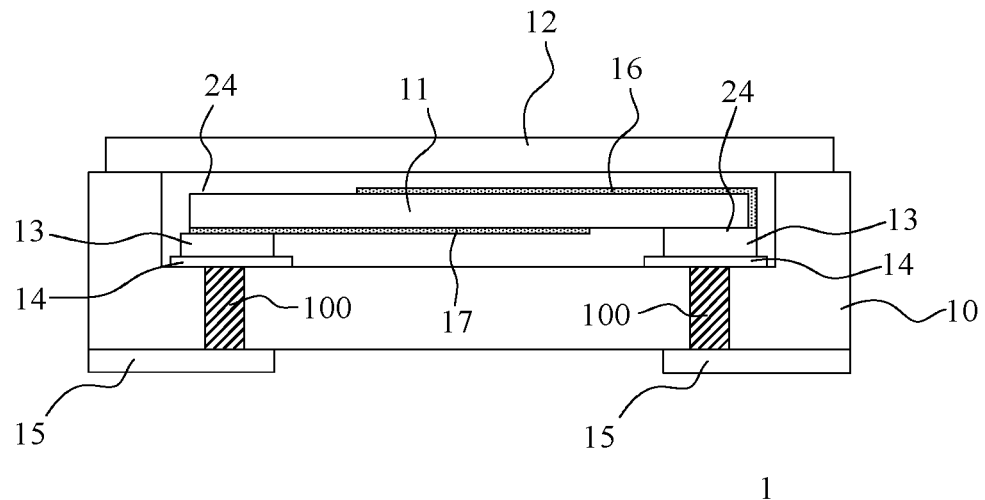
FIG. 1(a) is a cross-sectional view of a quartz resonator in the conventional technology.
Figure 1B:
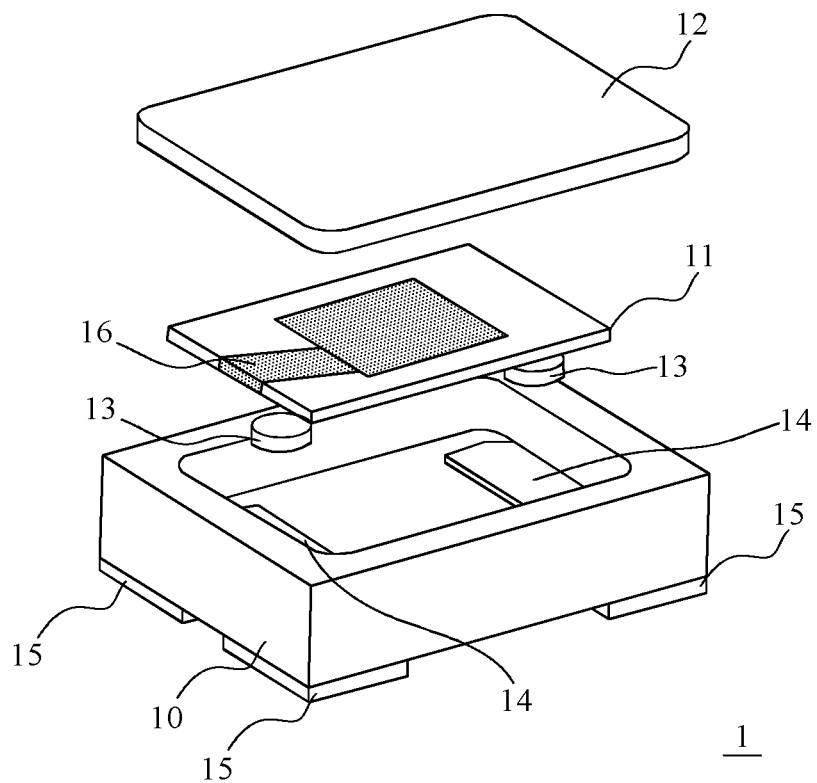
FIG. 1(b) is an exploded view of a quartz resonator in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

Further, in the present specification and claims, the term "comprising" is open type and should not be viewed as the term "consisted of." Besides, the term "electrically coupled" can be referring to either directly connecting or indirectly connecting between elements. Thus, if it is described in the below contents of the present invention that a first device is electrically coupled to a second device, the first device can be directly connected to the second device, or indirectly connected to the second device through other devices or means. Moreover, when the transmissions or generations of electrical signals are mentioned, one skilled in the art should understand some degradations or undesirable transformations could be generated during the operations. If it is not specified in the specification, an electrical signal at the transmitting end should be viewed as substantially the same signal as that at the receiving end. For example, when the end A of an electrical circuit provides an electrical signal S to the end B of the electrical circuit, the voltage of the electrical signal S may drop due to passing through the source and drain of a transistor or due to some parasitic capacitance. However, the transistor is not deliberately used to generate the effect of degrading the signal to achieve some result, that is, the signal S at the end A should be viewed as substantially the same as that at the end B.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." Besides, any embodiment of the present invention or the scope of the patent claim does not need to achieve all the objectives or advantages or features disclosed in the present invention. In addition, the abstract and title are only used to assist in searching for patent rather than limit the scope of patent claim.

Figure 2:
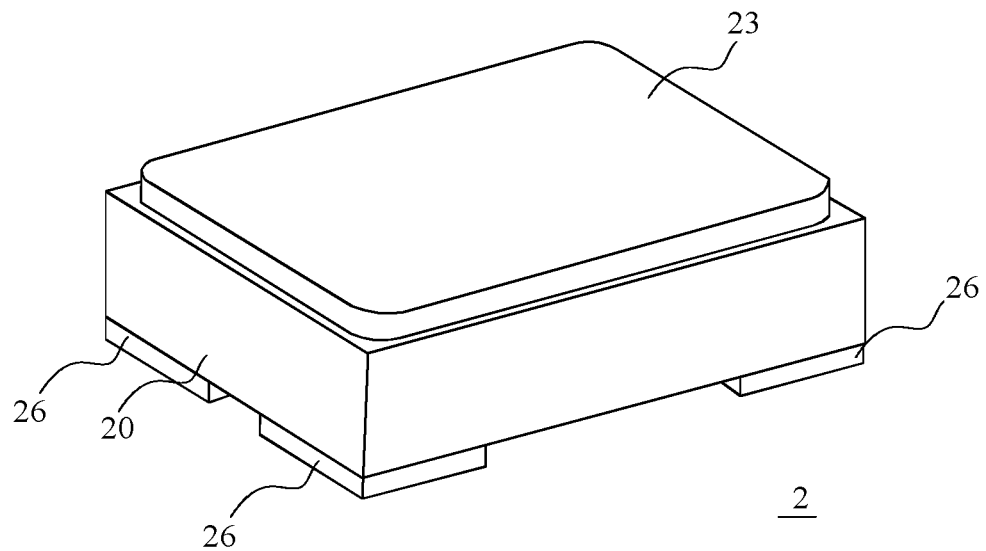
FIG. 2 is a perspective view of a structure for packaging a crystal oscillator according to an embodiment of the present invention.
Figure 3:
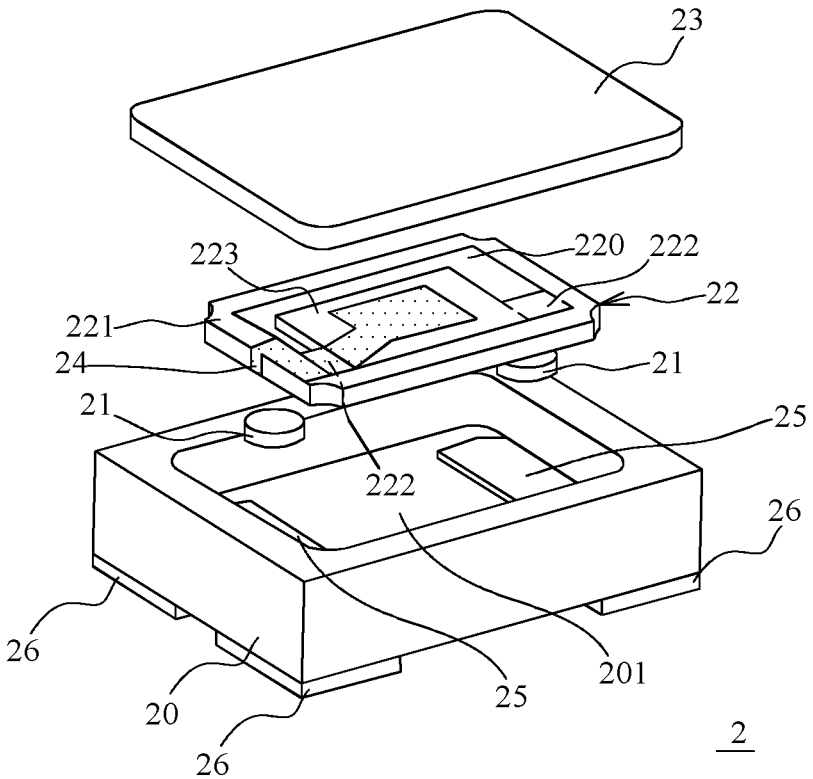
FIG. 3 is an exploded view of a structure for packaging a crystal oscillator according to an embodiment of the present invention.
Figure 4:
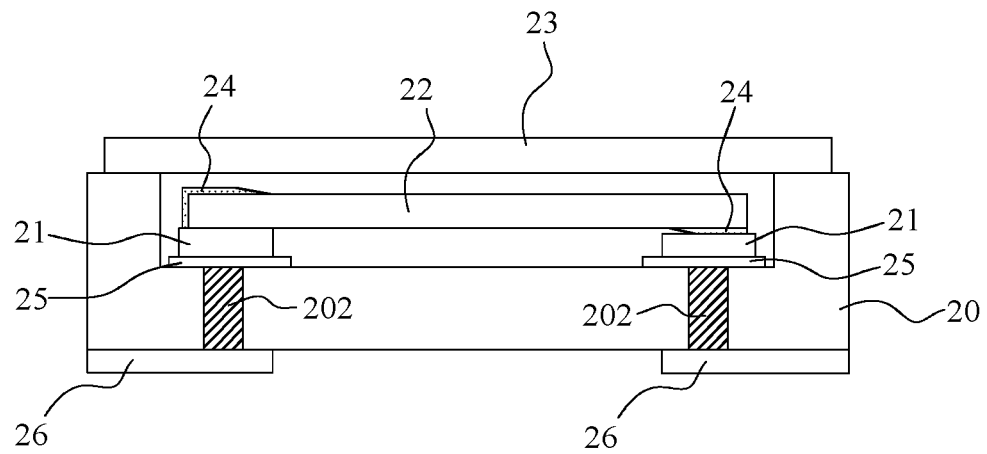
FIG. 4 is a cross-sectional view of a structure for packaging a crystal oscillator according to an embodiment of the present invention.

FIG. 2 is a perspective view of a structure for packaging a crystal oscillator according to an embodiment of the present invention. FIG. 3 is an exploded view of a structure for packaging a crystal oscillator according to an embodiment of the present invention. FIG. 4 is a cross-sectional view of a structure for packaging a crystal oscillator according to an embodiment of the present invention. Referring to FIG. 2, FIG. 3, and FIG. 4, the structure 2 for packaging a crystal oscillator of the present invention is introduced as follows. The structure 2 includes a package base 20, at least one glue 21, a resonant crystal blank 22, and a top cover 23. The package base 20 may be a ceramic base and the glue 21 may be a conductive glue, but the present invention is not limited thereto. The resonant crystal blank 22 may be, but not limited to, an AT-cut resonant crystal blank or a SC-cut resonant crystal blank. The top of the package base 20 has a recess 201. The glue 21 is formed in the recess 201. The number of the glues 21 may be even. The glue 21 is uniformly formed in the recess 201. The resonant crystal blank 22 has at least one opening 220, at least one border area 221, at least one connection area 222, and a resonant area 223. The opening 220 is arranged between the border area 221 and the resonant area 223. The border area 221 is connected to the resonant area 223 through the connection area 222. The border area 221 is formed in the recess 201 through the glue 21 and used to stabilize the resonant crystal blank 22. The border area 221, the connection area 222, and the resonant area 223 may be quartz crystal. Since the opening 220 is formed between the border area 221 and the resonant area 223 and the border area 221 separates the glue 21 from the resonant area 223, the sensitivity of the variation of a dispensing process to the resonant frequency is greatly reduced and the mechanical vibration generated by the resonant area 223 is not transmitted to outside, thereby stabilizing the resonant frequency. In some embodiments of the present invention, the ratio of the area of the opening 220 to the total area of the opening 220, the border area 221, the connection area 222, and the resonant area 223 is larger than 0. The ratio is less than or equal to 0.35. Thus, the opening 220 can effectively reduce the vibration caused by the resonant crystal blank 22 and transmitted to outside when the resonant crystal blank 22 resonates.

In some embodiments of the present invention, the structure 2 for packaging a crystal oscillator may further include an electrode layer 24, at least one first conductive pad 25, and a plurality of second conductive pads 26. For convenience and clarity, the number of the first conductive pads 25 is two. The electrode layer 24 is formed on the border area 221, the connection area 222, and the resonant area 223 and electrically connected to the resonant area 223 and the glue 21. The first conductive pad 25 is formed in the recess 201 and formed between the glue 21 and the package base 20. The bottom of the package base 20 is penetrated with conductive vias 202. The conductive vias 202 are electrically connected to the first conductive pad 25. The second conductive pads 26 are formed on the bottom surface of the package base 20 and respectively electrically connected to the conductive vias 202.

Figure 5:
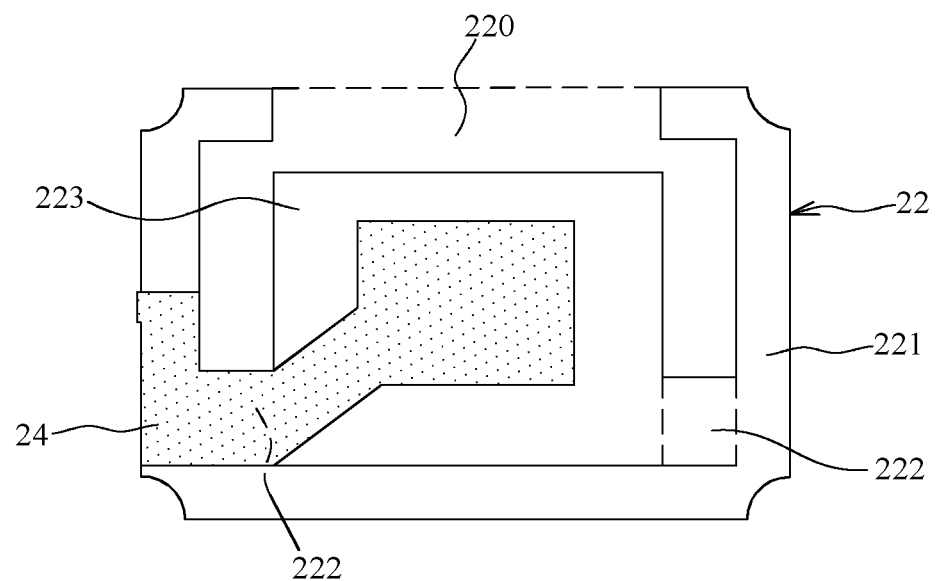
FIGS. 5-10 are top views of a structure for packaging a crystal oscillator according to various embodiments of the present invention.
Figure 6:
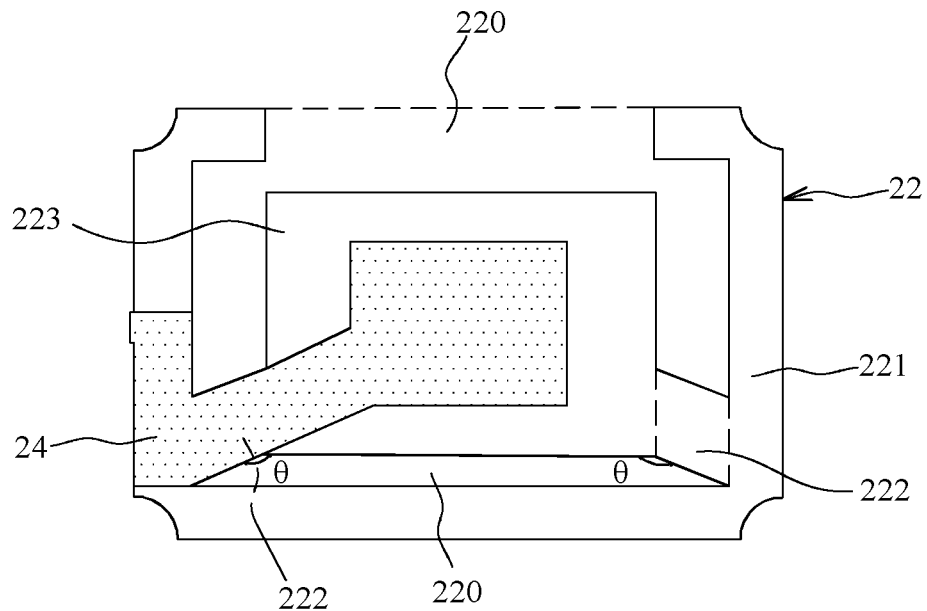
Figure 7:
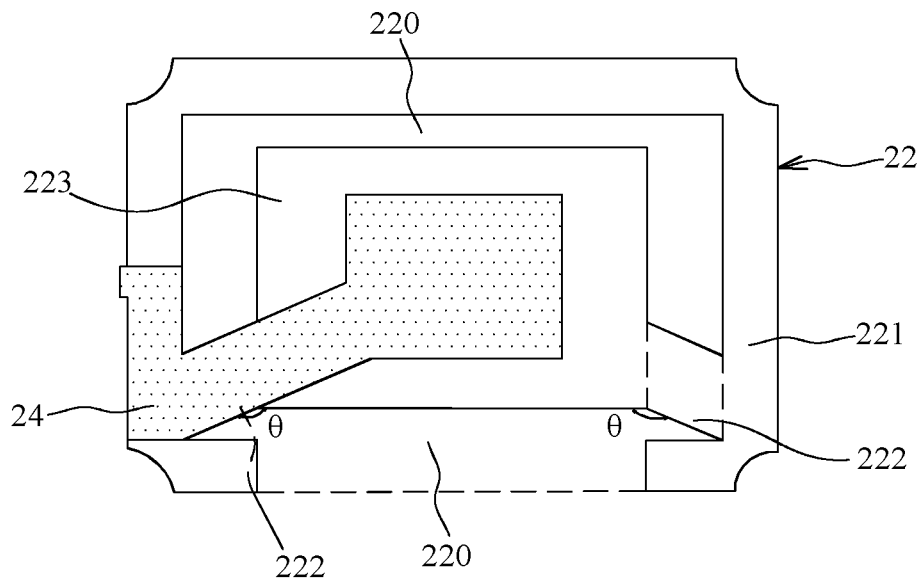
Figure 8:
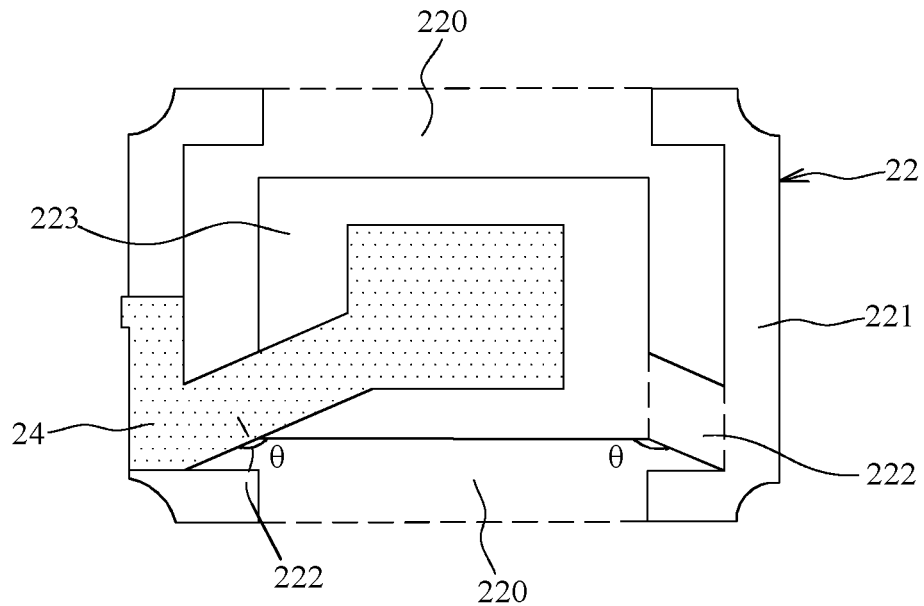
Figure 9:
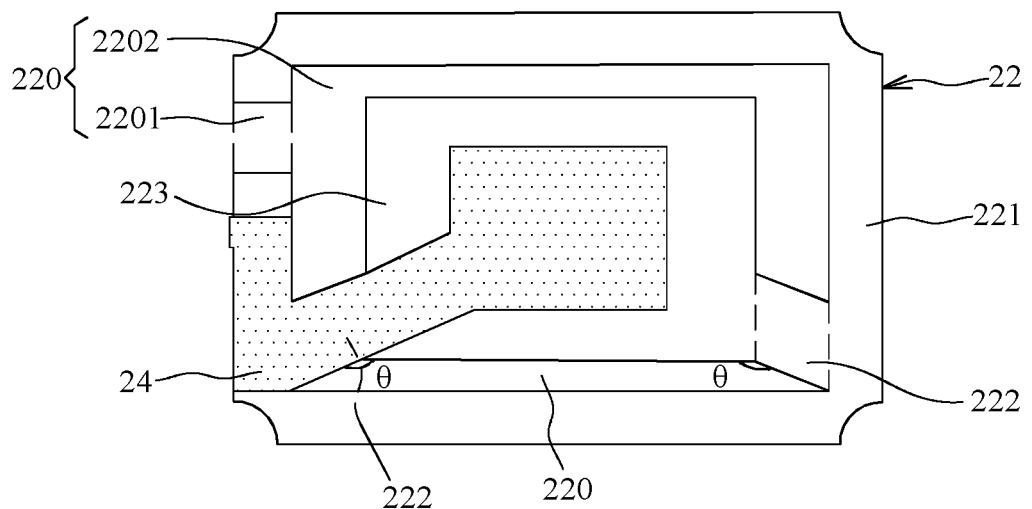
Figure 10:
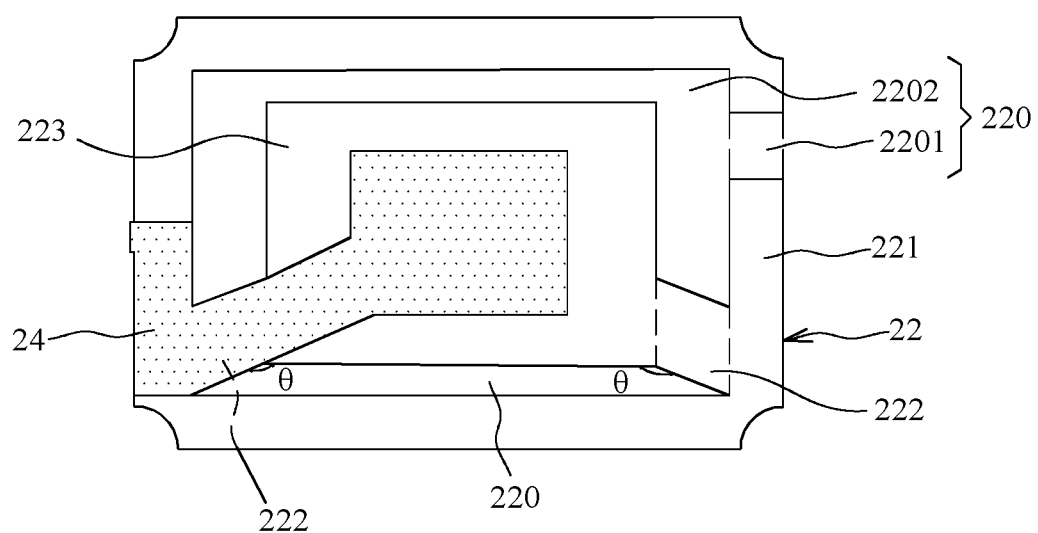
Figure 11:
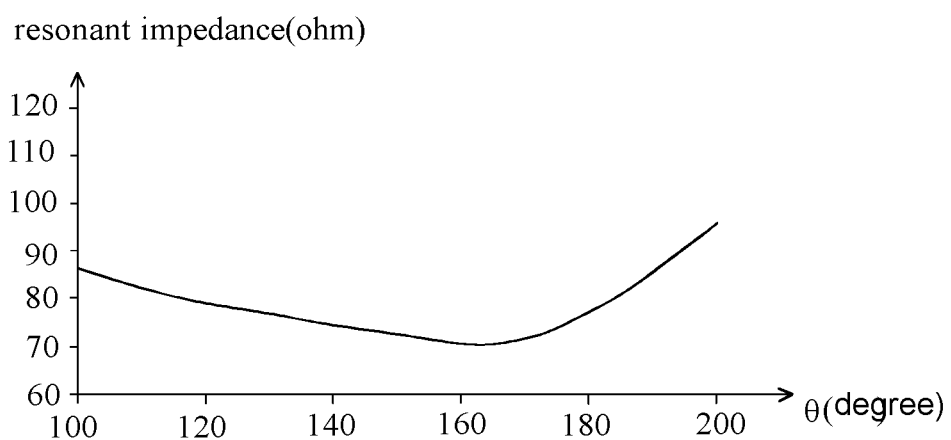
FIG. 11 is a diagram illustrating a curve of an included angle versus a resonant impedance of the present invention.

FIGS. 5-10 are top views of a structure for packaging a crystal oscillator according to various embodiments of the present invention. The different positions of the openings 220 of the resonant crystal blank 22 are introduced as follows. As illustrated in FIG. 5, the number of the opening 220 is one and the opening 220 is an opened-type opening. As illustrated in FIG. 6, the number of the openings 220 is two and the at least one opening 220 includes a closed-type opening and an opened-type opening. The opened-type opening has a shape of U. As illustrated in FIG. 7, the number of the openings 220 is two and the at least one opening 220 includes a closed-type opening and an opened-type opening. The closed-type opening has a shape of U. As illustrated in FIG. 8, the number of the openings 220 is two and the at least one opening 220 includes two opened-type openings. As illustrated in FIG. 9, the number of the openings 220 is two and the at least one opening 220 includes a closed-type opening and an opened-type opening. The opened-type opening includes a first sub-opening 2201 and a second sub-opening 2202. The first sub-opening 2201 is arranged between the head end and the tail end of the border area 221. The second sub-opening 2202 is surrounded by the first sub-opening 2201, the border area 221, the connection area 222, and the resonant area 223. Besides, the first sub-opening 2201 is closer to the electrode layer 24. As illustrated in FIG. 10, the number of the openings 220 is two and the at least one opening 220 includes a closed-type opening and an opened-type opening. The opened-type opening includes a first sub-opening 2201 and a second sub-opening 2202. The first sub-opening 2201 is arranged between the head end and the tail end of the border area 221. The second sub-opening 2202 is surrounded by the first sub-opening 2201, the border area 221, the connection area 222, and the resonant area 223. Besides, the first sub-opening 2201 is far from the electrode layer 24. FIG. 11 is a diagram illustrating a curve of an included angle versus a resonant impedance of the present invention. Referring to FIGS. 6-11, the resonant area 223 has a shape of rectangular, and an included angle θ between the connection area 222 and the long edge of the rectangular is larger than 120 degrees and less than 180 degrees. This way, the resonant impedance of the structure for packaging a crystal oscillator can have a narrower range.

According to the embodiments provided above, the structure for packaging a crystal oscillator forms the opening between the border area and the resonant area to avoid transmitting the vibration caused by a fact that the crystal blank resonates to outside, thereby stabilizing the resonant frequency.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A structure for packaging a crystal oscillator comprising:
   a package base with a top thereof having a recess;
   at least one glue formed in the recess;
   a resonant crystal blank having openings, at least one border area, at least one connection area, and a resonant area, wherein the openings are arranged between the at least one border area and the resonant area, the at least one border area is connected to the resonant area through the at least one connection area, and the at least one border area is formed on the at least one glue in the recess; and
   a top cover formed on a top of the package base, wherein the top cover closes the recess, the at least one glue, and the resonant crystal blank;
   wherein the openings comprise a closed-type opening and an opened-type opening;
   the opened-type opening comprises a first sub-opening and a second sub-opening, the first sub-opening is arranged between a head end and a tail end of the at least one border area, and the second sub-opening is surrounded by the first sub-opening, the at least one border area, the at least one connection area, and the resonant area.

2. The structure for packaging a crystal oscillator according to claim 1, wherein the at least one glue is a conductive glue.

3. The structure for packaging a crystal oscillator according to claim 2, further comprising:
   an electrode layer formed on the at least one border area, the at least one connection area, and the resonant area and electrically connected to the resonant area and the at least one glue;
   at least one first conductive pad formed in the recess and formed between the at least one glue and the package base, a bottom of the package base is penetrated with conductive vias, and the conductive vias are electrically connected to the at least one first conductive pad; and
   a plurality of second conductive pads formed on a bottom surface of the package base and respectively electrically connected to the conductive vias.

4. The structure for packaging a crystal oscillator according to claim 1, wherein a ratio of an area of the at least one opening to a total area of the at least one opening, the at least one border area, the at least one connection area, and the resonant area is larger than 0, and the ratio is less than or equal to 0.35.

5. The structure for packaging a crystal oscillator according to claim 1, wherein the closed-type opening or the opened-type opening has a shape of U.

6. The structure for packaging a crystal oscillator according to claim 1, wherein the resonant crystal blank is an AT-cut resonant crystal blank or a SC-cut resonant crystal blank.

7. The structure for packaging a crystal oscillator according to claim 1, wherein number of the at least one glue is even and the at least one glue is uniformly formed in the recess.

8. The structure for packaging a crystal oscillator according to claim 1, wherein the resonant area has a shape of rectangular, and an included angle between the at least one connection area and a long edge of the rectangular is larger than 120 degrees and less than 180 degrees.

9. A structure for packaging a crystal oscillator comprising:
a package base with a top thereof having a recess;
at least one glue formed in the recess;
a resonant crystal blank having at least one opening, at least one border area, at least one connection area, and a resonant area, wherein the at least one opening is arranged between the at least one border area and the resonant area, the at least one border area is connected to the resonant area through the at least one connection area, and the at least one border area is formed on the at least one glue in the recess; and
a top cover formed on a top of the package base, wherein the top cover closes the recess, the at least one glue, and the resonant crystal blank;
wherein the at least one opening comprises two opened-type openings;
wherein the resonant area has a shape of rectangular, and an included angle between the at least one connection area and a long edge of the rectangular is larger than 120 degrees and less than 180 degrees.

* * * * *